(12) United States Patent
Mignard et al.

(10) Patent No.: US 8,487,846 B2
(45) Date of Patent: *Jul. 16, 2013

(54) SYSTEM AND METHOD OF SENSING ACTUATION AND RELEASE VOLTAGES OF AN INTERFEROMETRIC MODULATOR

(75) Inventors: Marc Mignard, Berkeley, CA (US); Clarence Chui, San Mateo, CA (US); Mithran C Mathew, Mountain View, CA (US); Jeffrey B Sampsell, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/483,984

(22) Filed: May 30, 2012

(65) Prior Publication Data

US 2012/0235981 A1    Sep. 20, 2012

Related U.S. Application Data

(63) Continuation of application No. 12/468,004, filed on May 18, 2009, now Pat. No. 8,207,920, which is a continuation of application No. 11/045,865, filed on Jan. 28, 2005, now Pat. No. 7,551,159.

(60) Provisional application No. 60/604,892, filed on Aug. 27, 2004.

(51) Int. Cl.
*G09G 3/34*    (2006.01)

(52) U.S. Cl.
USPC .............. 345/84; 345/108; 359/290; 359/292

(58) Field of Classification Search
USPC ................ 345/55, 84, 85; 359/247, 290, 291, 359/902, 904
See application file for complete search history.

(56) References Cited

U.S. PATENT DOCUMENTS

| | | | |
|---|---|---|---|
| 4,954,789 | A | 9/1990 | Sampsell |
| 5,305,640 | A | 4/1994 | Boysel et al. |
| 5,526,688 | A | 6/1996 | Boysel et al. |
| 5,550,373 | A | 8/1996 | Cole et al. |

(Continued)

FOREIGN PATENT DOCUMENTS

| | | |
|---|---|---|
| EP | 1 004 910 | 5/2000 |
| JP | 2002062493 A | 2/2002 |

(Continued)

OTHER PUBLICATIONS

Miles, MEMS-based interferometric modulator for display applications, Part of the SPIE Conference on Micromachined Devices and Components, 3876:20-28 (1999).

(Continued)

*Primary Examiner* — Koosha Sharifi-Tafreshi
(74) *Attorney, Agent, or Firm* — Knobbe Martens Olson & Bear LLP

(57) ABSTRACT

A method for sensing the actuation and/or release voltages of a electromechanical system or a microelectromechanical device include applying a varying voltage to the device and sensing its state and different voltage levels. In one embodiment, the device is part of a system comprising an array of interferometric modulators suitable for a display. The method can be used to compensate for temperature dependent changes in display pixel characteristics.

22 Claims, 16 Drawing Sheets

U.S. PATENT DOCUMENTS

| | | | |
|---|---|---|---|
| 5,551,293 | A | 9/1996 | Boysel et al. |
| 5,784,189 | A | 7/1998 | Bozler et al. |
| 5,835,255 | A | 11/1998 | Miles |
| 6,028,689 | A * | 2/2000 | Michalicek et al. ....... 359/224.1 |
| 6,040,937 | A | 3/2000 | Miles |
| 6,195,196 | B1 | 2/2001 | Kimura et al. |
| 6,275,326 | B1 | 8/2001 | Bhalla et al. |
| 6,320,394 | B1 | 11/2001 | Tartagni |
| 6,356,085 | B1 | 3/2002 | Ryat et al. |
| 6,392,233 | B1 | 5/2002 | Channin et al. |
| 6,407,560 | B1 | 6/2002 | Walraven et al. |
| 6,480,645 | B1 | 11/2002 | Peale et al. |
| 6,529,654 | B1 | 3/2003 | Wong et al. |
| 6,545,495 | B2 | 4/2003 | Warmack et al. |
| 6,574,033 | B1 | 6/2003 | Chui et al. |
| 6,674,562 | B1 | 1/2004 | Miles et al. |
| 6,680,792 | B2 * | 1/2004 | Miles ........................... 359/291 |
| 6,771,851 | B1 | 8/2004 | Yang |
| 6,788,520 | B1 | 9/2004 | Behin et al. |
| 7,026,821 | B2 | 4/2006 | Martin et al. |
| 7,123,216 | B1 | 10/2006 | Miles |
| 7,126,741 | B2 | 10/2006 | Wagner et al. |
| 7,142,346 | B2 | 11/2006 | Chui et al. |
| 7,161,728 | B2 | 1/2007 | Sampsell et al. |
| 7,327,510 | B2 | 2/2008 | Cummings et al. |
| 7,551,159 | B2 | 6/2009 | Mignard et al. |
| 7,889,163 | B2 | 2/2011 | Chui et al. |
| 2001/0051014 | A1 | 12/2001 | Behin et al. |
| 2002/0075555 | A1 | 6/2002 | Miles |
| 2002/0093446 | A1 | 7/2002 | Horsley et al. |
| 2003/0020699 | A1 | 1/2003 | Nakatani et al. |
| 2003/0155932 | A1 * | 8/2003 | Staple et al. .................. 324/525 |
| 2003/0164814 | A1 | 9/2003 | Starkweather et al. |
| 2003/0201777 | A1 | 10/2003 | Gogoi et al. |
| 2004/0070400 | A1 | 4/2004 | van Spengen |
| 2004/0223204 | A1 | 11/2004 | Mao et al. |

FOREIGN PATENT DOCUMENTS

| | | |
|---|---|---|
| JP | 2002-341267 | 11/2002 |
| WO | WO 95/30924 | 11/1995 |
| WO | WO 01/73934 | 10/2001 |
| WO | WO 01/73937 | 10/2001 |
| WO | WO 02/086582 | 10/2002 |
| WO | WO 03/019509 | 3/2003 |

OTHER PUBLICATIONS

Miles et al., 2000, 5.3: Digital Paper™: Reflective displays using interferometric modulation, SID Digest, vol. XXXI, pp. 32-35.
Office Action dated Feb. 11, 2008 in U.S. Appl. No. 11/045,865.
Office Action dated Aug. 25, 2008 in U.S. Appl. No. 11/045,865.
Office Action dated Feb. 1, 2008 in Chinese App. No. 200510093578.7.
Extended European Search Report dated Mar. 13, 2008 for App. No. 05255180.1.
Notice of Reasons for Rejection in Japanese App. No. 2005-243599, Dated Jul. 1, 2008.
Notice of Reasons for Rejection in Japanese App. No. 2005-243599, Dated Oct. 6, 2009.
Notice of Reasons for Rejection in Japanese App. No. 2005-243599, Dated Jun. 29, 2010.
Decision of Rejection in Japanese App. No. 2005-243599, dated Jun. 7, 2011.
Notice to Submit a Response dated Nov. 30, 2011 in Korean App. No. 10-2005-0078972.
Final Office Action dated Apr. 26, 2012 in Korean App. No. 10-2005-0078972.
Official Communication dated Jul. 6, 2012 in European App. No. 05255180.1.
First Office Action dated Oct. 16, 2012 in Japanese patent application No. 2010-243723.
Office Action dated Aug. 10, 2012 in Taiwan patent application No. 094127806.

* cited by examiner

United States Patent

SYSTEM AND METHOD OF SENSING ACTUATION AND RELEASE VOLTAGES OF AN INTERFEROMETRIC MODULATOR

CROSS REFERENCE TO RELATED APPLICATIONS

This application is a continuation of co-pending U.S. patent application Ser. No. 12/468,004, entitled "System And Method Of Sensing Actuation And Release Voltages Of An Interferometric Modulator" filed on May 18, 2009, which is a continuation of U.S. patent application Ser. No. 11/045,865 entitled "System And Method Of Sensing Actuation And Release Voltages Of An Interferometric Modulator" filed on Jan. 28, 2005, now U.S. Pat. No. 7,551,159, which claims the benefit of U.S. Provisional Application No. 60/604,892, titled "SENSING STATUS OF A MEMS MEMORY DEVICE," filed Aug. 27, 2004. The disclosure of each of these applications is hereby incorporated by reference, in its entirety.

BACKGROUND

1. Field

The field of the invention relates to electromechanical systems (EMS) and microelectromechanical systems (MEMS).

2. Description of the Related Technology

Electromechanical systems (EMS) and microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be partially transparent and capable of relative motion upon application of an appropriate electrical signal. One plate may comprise a stationary layer deposited on a substrate, the other plate may comprise a metallic membrane suspended over the stationary layer. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

In one embodiment, a mirror system comprising: an interferometric modulator array of mirrors, a timing control circuit for activating each of the mirrors, a drive circuit configured to apply one or more test voltages or currents, and a sensing circuit configured to sense a state of at least one of the mirrors and determine one or both of an actuation voltage and a release voltage based at least in part on the sensed state of the mirror.

In another embodiment, a method of pixel state sensing for modifying a drive voltage of an array of mirrors and a timing control circuit for controlling each of the mirrors, the method comprising applying a first test voltage or current to charge a mirror for a predetermined amount of time, sensing a first state of the mirror to determine a first actuation or release voltage, applying a second test voltage or current to charge the mirror for the predetermined amount of time, sensing a second state of the mirror to determine a second actuation or release voltage, and modifying the drive voltage based on the determined first and second actuation or release voltages to control a voltage at which the mirror is actuated or released.

In another embodiment, a system for calibrating a drive voltage for an array of mirrors and a timing control circuit for controlling each of the mirrors, the system comprising means for applying a first test voltage or current to charge a mirror for a predetermined amount of time, means for sensing a first state of the mirror to determine a first actuation or release voltage, means for applying a second test voltage or current to charge the mirror for the predetermined amount of time, means for sensing a second state of the mirror to determine a second actuation or release voltage, and means for modifying the drive voltage based on the determined first and second actuation or release voltages to control a voltage at which the mirror is actuated or released.

DETAILED DESCRIPTION OF PREFERRED EMBODIMENTS

The following detailed description is directed to certain specific embodiments of the invention. However, the invention can be embodied in a multitude of different ways as defined and covered by the claims. In this description, reference is made to the drawings wherein like parts are designated with like numerals throughout.

Embodiments of the invention may be implemented in any device that is configured to display an image, whether in motion (e.g., video) or stationary (e.g., still image), and whether textual or pictorial. More particularly, it is contemplated that the invention may be implemented in or associated with a variety of electronic devices such as, but not limited to, mobile telephones, wireless devices, personal data assistants (PDAs), hand-held or portable computers, electronic books, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry).

MEMS devices of similar structure to those described herein can also be used in non-display applications such as in electronic switching devices.

Figure 1:
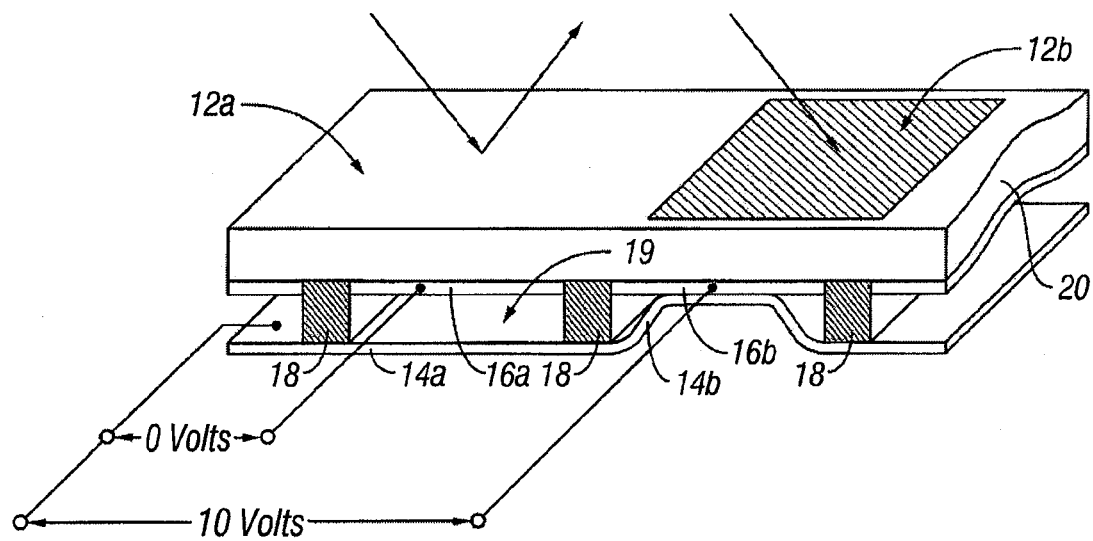
FIG. 1 is an isometric view depicting a portion of one embodiment of an interferometric modulator display in which a movable mirror of a first interferometric modulator is in a reflective, or "on," position at a predetermined distance from a fixed mirror and the movable mirror of a second interferometric modulator is in a non-reflective, or "off" position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a released position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined air gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
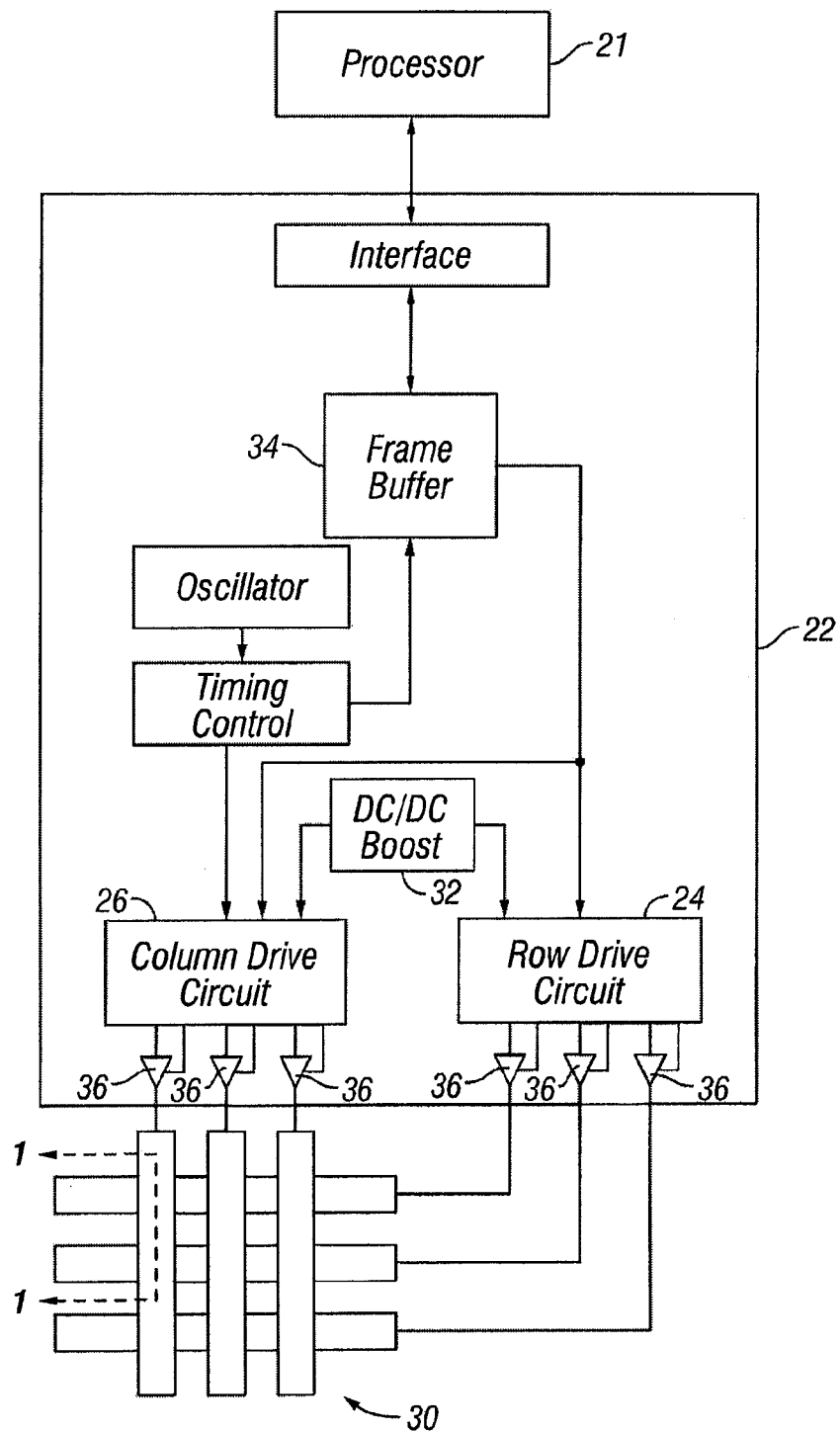
FIG. 2 is a system block diagram illustrating one embodiment of an electronic device incorporating a 3×3 interferometric modulator display.

FIGS. 2 through 4 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any other suitable processor. In addition, the processor 21 may comprise any special purpose microprocessor such as a digital signal processor, microcontroller, or a programmable gate array. As is conventional in the art, the processor 21 may be configured to execute one or more software modules. In addition to executing an operating system (not shown), the processor may be configured to execute one or more software applications, including a web browser, a telephone application, an email program, or any other software application. It will be appreciated that all of the functionality described herein may be implemented in whole or part in hardware, software, or a combination thereof.

In one embodiment, the processor 21 is also configured to communicate with an array controller 22. In one embodiment, the array controller 22 includes a row driver circuit 24 and a column driver circuit 26 that provide signals to the array 30. The cross section of the array illustrated in FIG. 1 is shown by the lines 1-1 in FIG. 2. The array control 22 may also include a boost circuit 32 for converting control signals to a voltage or voltages sufficient for driving the array 30. In one embodiment, the display control 22 also includes a frame buffer 34. The frame buffer typically includes sufficient memory to store the current displayed frame for refresh purposes.

A plurality of tri-state buffers 36 are advantageously provided on each of the columns and each of the rows of array 30. The tri-state buffers 36 are connected to hold-mode signals which open the connection to the respective row or column of the array when they are asserted. When the hold-mode select lines are asserted, lines from the driver to the array are opened, substantially eliminating any leakage path for the charge stored on each pixel capacitance. The pixels are thus held in the previously charged or discharged state without any driver input, until the charge slowly dissipates, either through leakage across the pixel or through a non-infinite tri-state open resistance. It will be appreciated that any controllable series switch such as a series FET could be used to implement this display/driver decoupling.

Figures 3A, 3B:
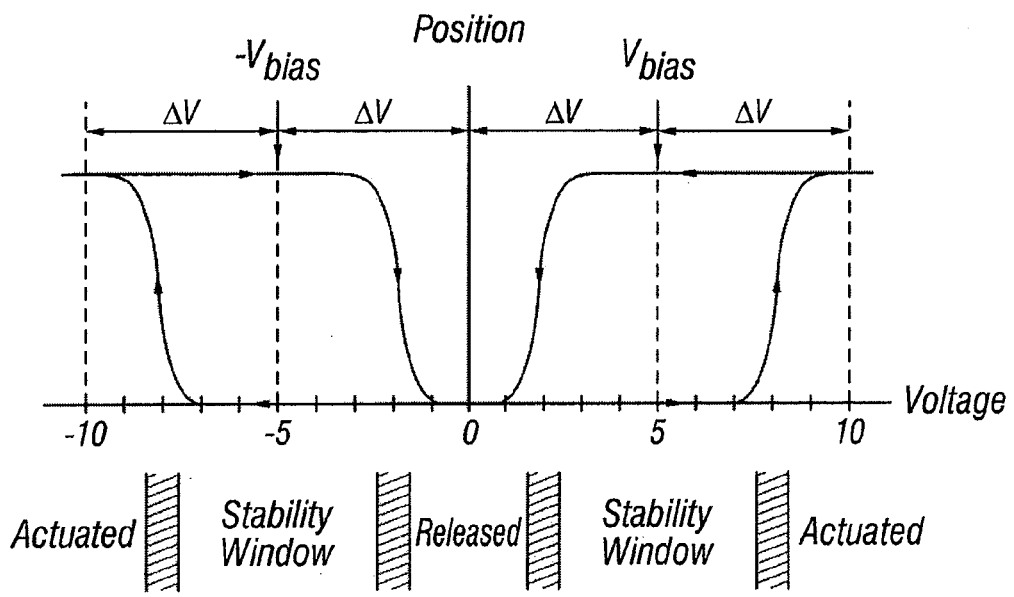
FIG. 3A is a diagram of movable mirror position versus applied voltage for one exemplary embodiment of an interferometric modulator of FIG. 1.
FIG. 3B is an illustration of sets of row and column voltages that may be used to drive an interferometric modulator display.

For MEMS interferometric modulators, the row/column actuation protocol may take advantage of a hysteresis property of these devices illustrated in FIG. 3A. It may require, for example, a 10 volt potential difference to cause a movable layer to deform from the released state to the actuated state. However, when the voltage is reduced from that value, the movable layer maintains its state as the voltage drops back below 10 volts. In the exemplary embodiment of FIG. 3A, the movable layer does not release completely until the voltage drops below 2 volts. There is thus a range of voltage, about 3 to 7 V in the example illustrated in FIG. 3A, where there exists a window of applied voltage within which the device is stable in either the released or actuated state. This is referred to herein as the "hysteresis window" or "stability window." For a display array having the hysteresis characteristics of FIG. 3A, the row/column actuation protocol can be designed such that during row strobing, pixels in the strobed row that are to be actuated are exposed to a voltage difference of about 10 volts, and pixels that are to be released are exposed to a voltage difference of close to zero volts. After the strobe, the pixels are exposed to a steady state voltage difference of about 5 volts such that they remain in whatever state the row strobe put them. After being written, each pixel sees a potential difference within the "stability window" of 3-7 volts in this example. This feature makes the pixel design illustrated in FIG. 1 stable under the same applied voltage conditions in either an actuated or released pre-existing state. Since each pixel of the interferometric modulator, whether in the actuated or released state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

FIGS. 3B and 4 illustrate one possible actuation protocol for creating a display frame on the 3×3 array of FIG. 2. FIG. 3B illustrates a possible set of column and row voltage levels that may be used for pixels exhibiting the hysteresis curves of FIG. 3A. In the FIG. 3B embodiment, actuating a pixel involves setting the appropriate column to $-V_{bias}$, and the appropriate row to $+\Delta V$, which may correspond to −5 volts and +5 volts respectively Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 4A:
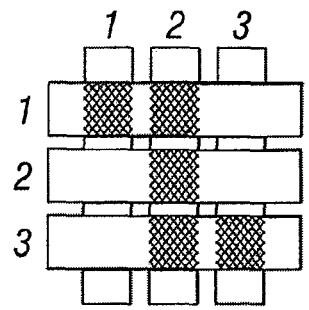
FIGS. 4A and 4B illustrate one exemplary timing diagram for row and column signals that may be used to write a frame of display data to the 3×3 interferometric modulator display of FIG. 2.
Figure 4B:
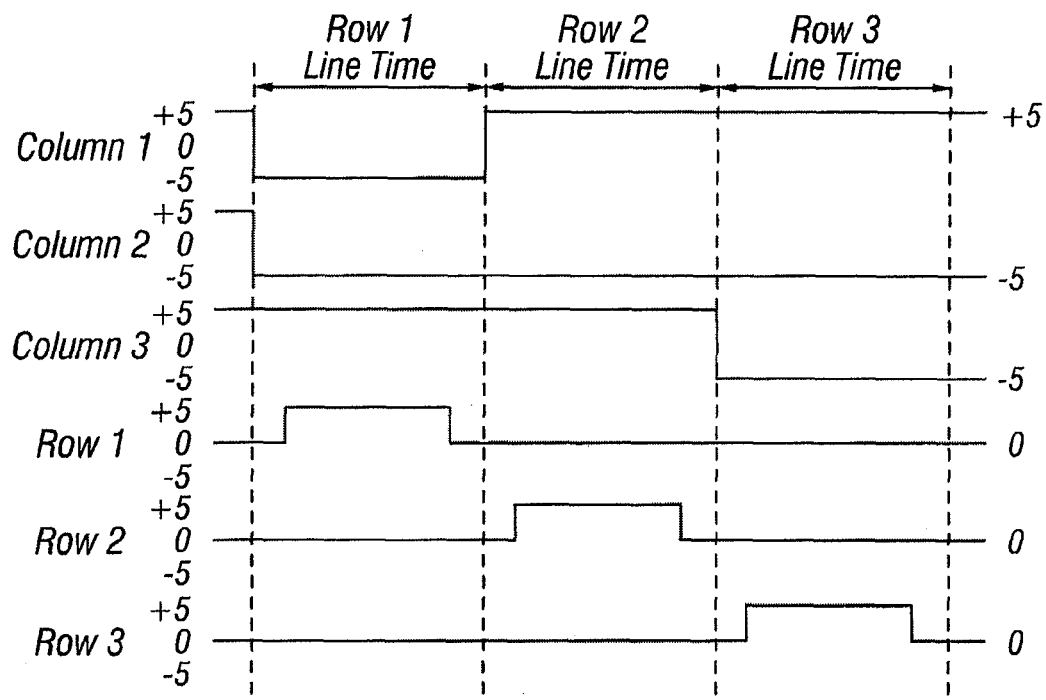

FIG. 4B is a timing diagram showing a series of row and column signals applied to the 3×3 array of FIG. 2 which will result in the display arrangement illustrated in FIG. 4A, where actuated pixels are non-reflective. Prior to writing the frame illustrated in FIG. 4A, the pixels can be in any state, and in this example, all the rows are at 0 volts, and all the columns are at +5 volts. With these applied voltages, all pixels are stable in their existing actuated or released states.

Figure 5A:
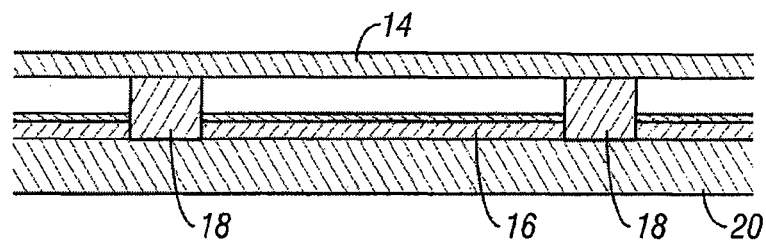
FIG. 5A is a cross section of the device of FIG. 1.

In the FIG. 4A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and release pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 4A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 5B:
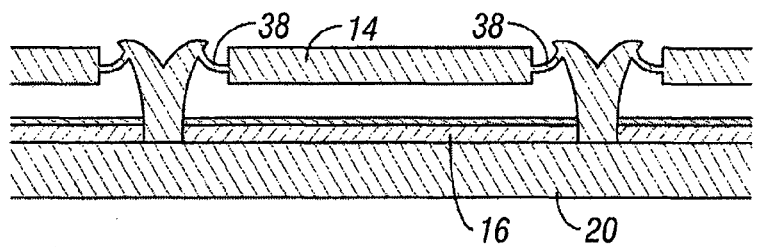
FIG. 5B is a cross section of an alternative embodiment of an interferometric modulator.
Figure 5C:
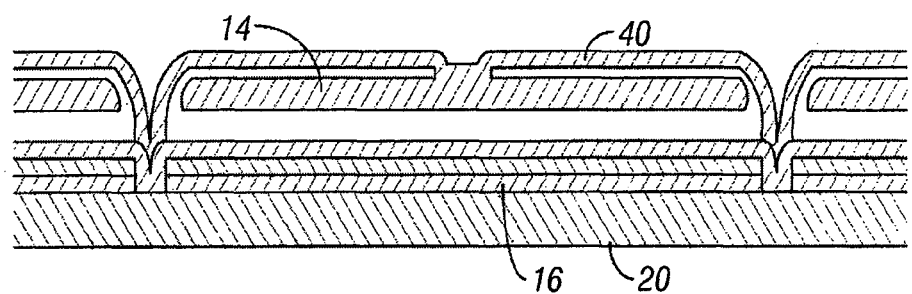
FIG. 5C is a cross section of an alternative embodiment of an interferometric modulator

The details of the structure of interferometric modulators that operate in accordance with the principles set forth above may vary widely. For example, FIGS. 5A-5C illustrate three different embodiments of the moving mirror structure. FIG. 5A is a cross section of the embodiment of FIG. 1, where a strip of metal material 14 is deposited on orthogonally extending supports 18. In FIG. 5B, the moveable reflective material 14 is attached to supports at the corners only, on tethers 38. In FIG. 5C, the moveable reflective material 14 is suspended from a deformable layer 40. This embodiment has benefits because the structural design and materials used for the reflective material 14 can be optimized with respect to the optical properties, and the structural design and materials used for the deformable layer 40 can be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

After a pixel is written, it can be advantageous to sense its state. For the bi-stable display of FIG. 1, the state of a pixel can be determined by taking advantage of the fact that the capacitance across the pixel mirrors is much larger, often about ten times larger, when the pixels are in the actuated state than when they are in the released state. This pixel capacitance value can be sensed in a variety of ways by sensing capacitance dependent electrical properties of the pixel, some of which are described in more detail below.

Figure 6:
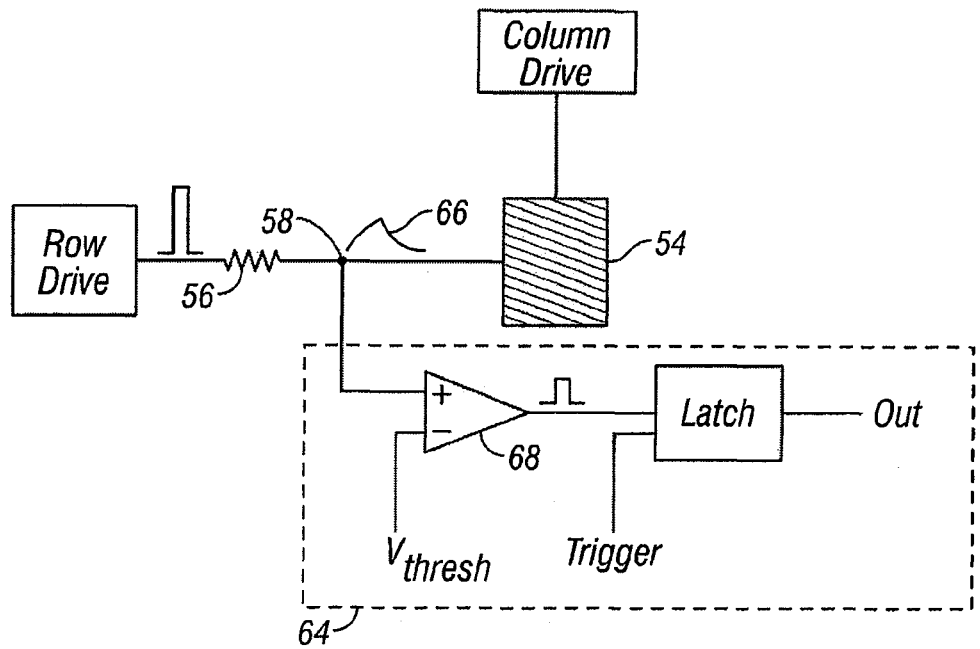
FIG. 6 is a schematic/block diagram of one embodiment of a state sensing circuit.
Figure 7:
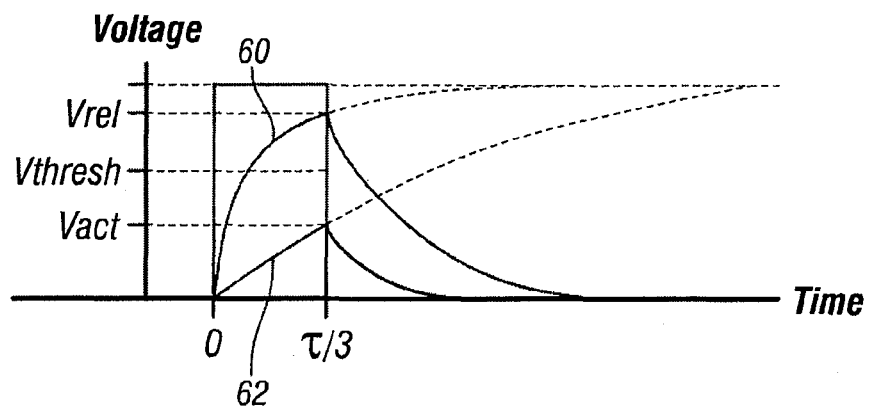
FIG. 7 is graph illustrating a voltage vs. time response to a voltage pulse for an interferometric modulator.

The principles of pixel state sensing will be described first with reference to a single pixel in isolation as illustrated in FIGS. 6-10. Referring now to FIG. 6, after pixel writing, whether the whole frame is complete or prior to that time, all the column tri-state buffers can be placed in the open (decoupled) configuration except one column containing the pixel to be tested. The row driver then applies a low amplitude pulse to the row electrode containing the pixel to be tested, which charges up in response to the increased voltage. As shown in FIG. 7, the voltage across the pixel will increase in response to this applied voltage in accordance with the RC time constant ($\tau$) of the circuit. For a single pixel in isolation, the capacitance is the capacitance of the pixel 54, and the resistance of the circuit may include the row driver output impedance and/or any filter resistor 56 that might be placed in series with the row electrode. The voltage at the test point 58 when the pixel 54 is in a low capacitance state (e.g. in the released state) will increase faster as illustrated by curve 60 than when the pixel 54 is in a high capacitance state (e.g. in the actuated state) as illustrated by curve 62. If the voltage across the pixel is determined at a certain time during this charging period, at $\tau/3$ for example, the state of the pixel can be determined. This voltage can be detected and measured by a voltage sensing circuit 64. If a pulse having a duration of $\tau/3$ is applied to the pixel, the voltage across the pixel will increase and decrease as shown in the trace 66 (also shown in FIG. 7). If this signal is applied to the input of a comparator 68 with $V_{thresh}$ applied to the negative input, a pulse will be output from the comparator only if the voltage across the pixel exceeded $V_{thresh}$ at some time during the pulse, where $V_{thresh}$ is defined as shown in FIG. 7. The output of the comparator 68 can be latched to produce an indication of whether that pixel is actuated (latch low) or released (latch high).

Figure 8:
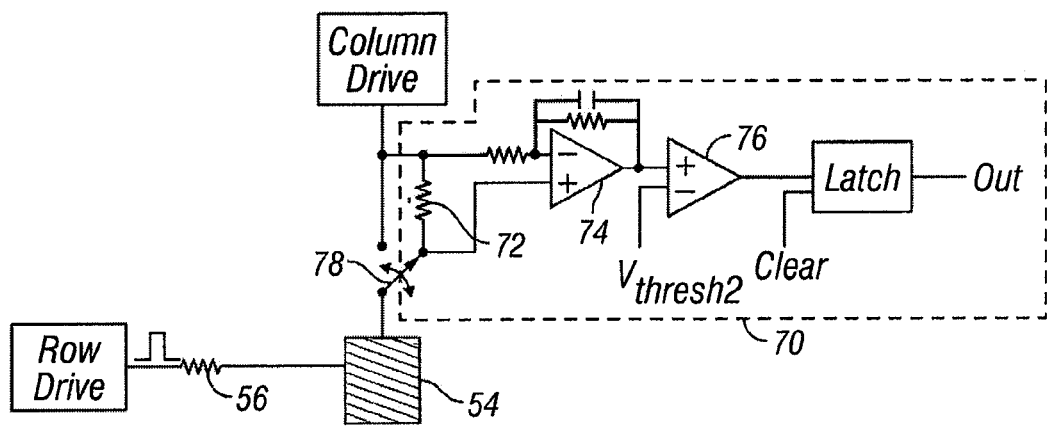
FIG. 8 is a schematic/block diagram of another embodiment of a state sensing circuit
Figure 9:
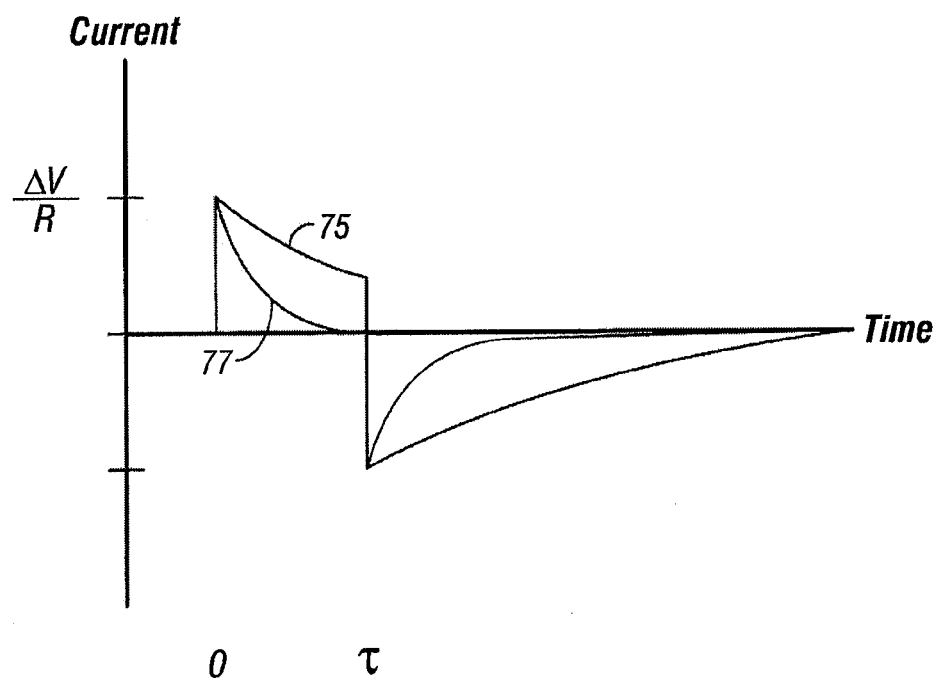
FIG. 9 is graph illustrating a current vs. time response to a voltage pulse for an interferometric modulator.

FIGS. 8 and 9 illustrate an alternative method of detecting pixel state. In FIG. 8, a current sensing circuit 70 is used rather than a voltage sensing circuit. A voltage pulse is applied as above, which causes a current pulse as the pixel capacitance charges. As illustrated in FIG. 9, this current pulse decays slower (curve 75) for a larger capacitance of pixel 54 than for a smaller capacitance (curve 77). The current pulse can be converted to a voltage pulse by measuring the voltage across a series resistance 72 in the column line (amplifiers configured as current to voltage converters could also be used). The voltage across the resistor can be sensed by an amplifier configured as an integrator 74 illustrated in FIG. 8. The output of the integrator can be routed to a similar comparator 76 and latch as in FIG. 6. The comparator 76 will only produce an output pulse if the current pulse through the circuit is sufficient (given the value of the resistor 72 and the time constant/amplification of the integrator 74) to produce a voltage at the comparator input greater than a threshold voltage $V_{thresh2}$ shown in FIG. 8. FIG. 8 shows a switch 78 used to switch resistance 72 into the column line, but it will be appreciated that this would not be necessary if a suitable filter resistor, for example, was already present.

Current sensing requires a slightly more complicated circuit than voltage sensing, but one advantage would be that all the pixels in a row could be probed by a single pulse since the charging current could be separately measured for each pixel along a row simultaneously with separate current sensors. In these embodiments, there may be a sensor dedicated to each column, or a set of current sensors could be sequentially switched between different groups of columns such that a portion, but not all of the column currents are sensed concurrently. This last embodiment would be slower than an embodiment with a sensor for every row, but faster than one at a time sensing.

Figure 10:
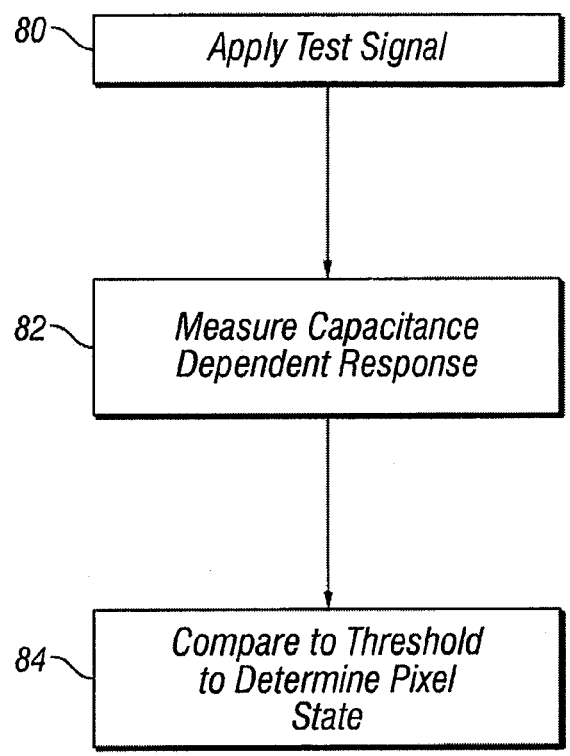
FIG. 10 is a flow chart of a state sensing process.

In accordance with the principles above, FIG. 10 is a flowchart illustrating an exemplary process for determining an open or closed state of an interferometric modulator. A test pulse is applied to the pixel at step 80. At step 82, a capacitance dependent response to the pulse is measured. At step 84, the response is compared to a threshold to determine the state of the pixel.

Pixel state sensing can be advantageous for a variety of reasons. For example, on the next frame update or refresh, only those pixels that are different from the next desired frame need be updated. For a static display, the pixel states may be monitored to detect which pixels have relaxed from an actuated state to a released state due to charge leakage. Selective updating could be performed in a variety of ways. For example, once one or more pixels change from the desired state, the driver circuitry could be turned back on, the tri-state buffers closed, and row strobing could be limited to only those rows which include pixels in an undesired state. Other rows could be skipped. This reduces the total energy required to update the display. Pixel state sensing could also be advantageous during the frame writing process, because as rows of pixels are written, they could be checked to determine if they were written correctly or not. If not, the row could be written again until correct. Pixel state sensing can also advantageously minimize the peak memory requirements for the frame buffer.

Figure 11:
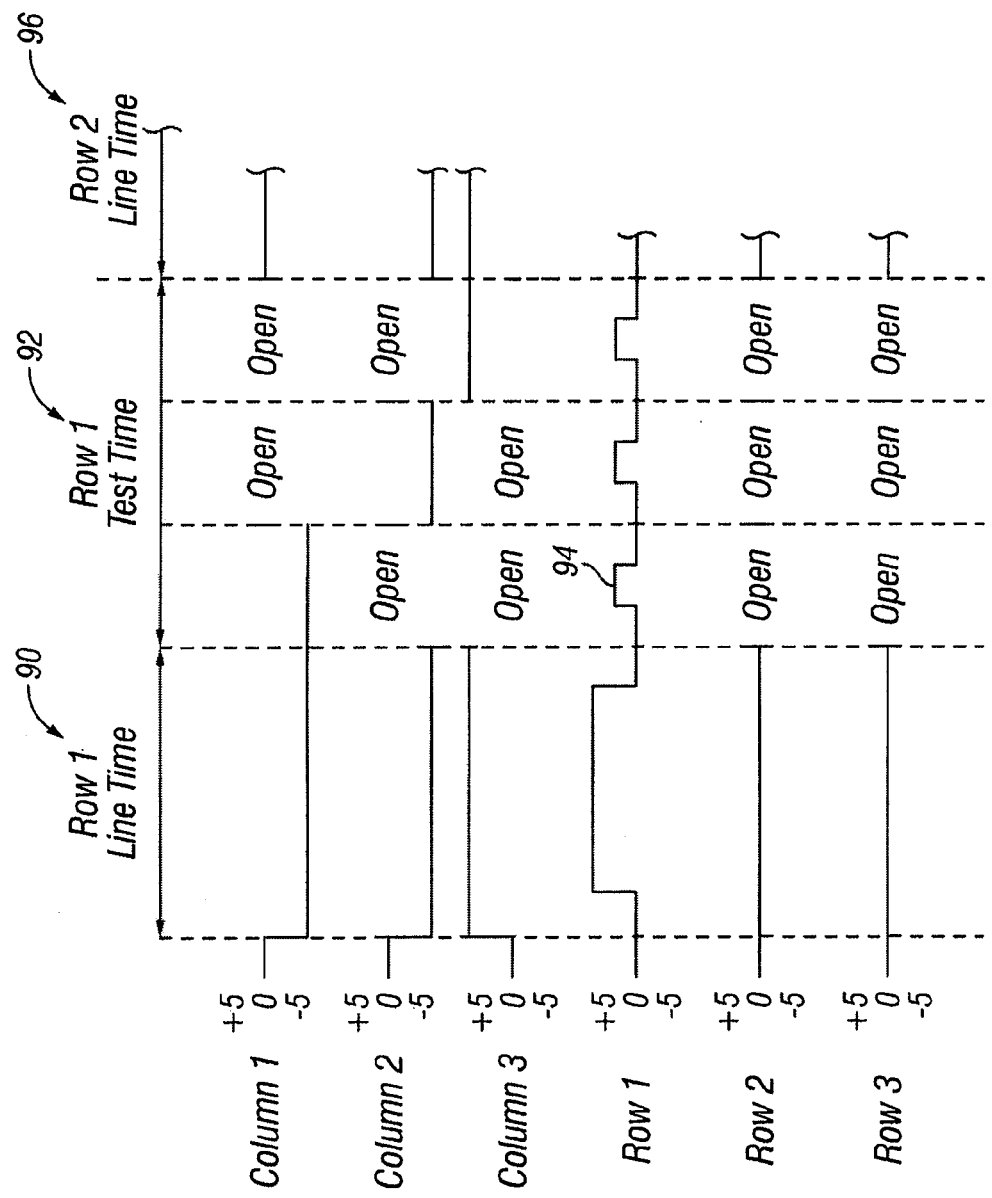
FIG. 11 is a timing diagram illustrating row and column voltages for setting and testing a row of interferometric modulators.
Figure 12:
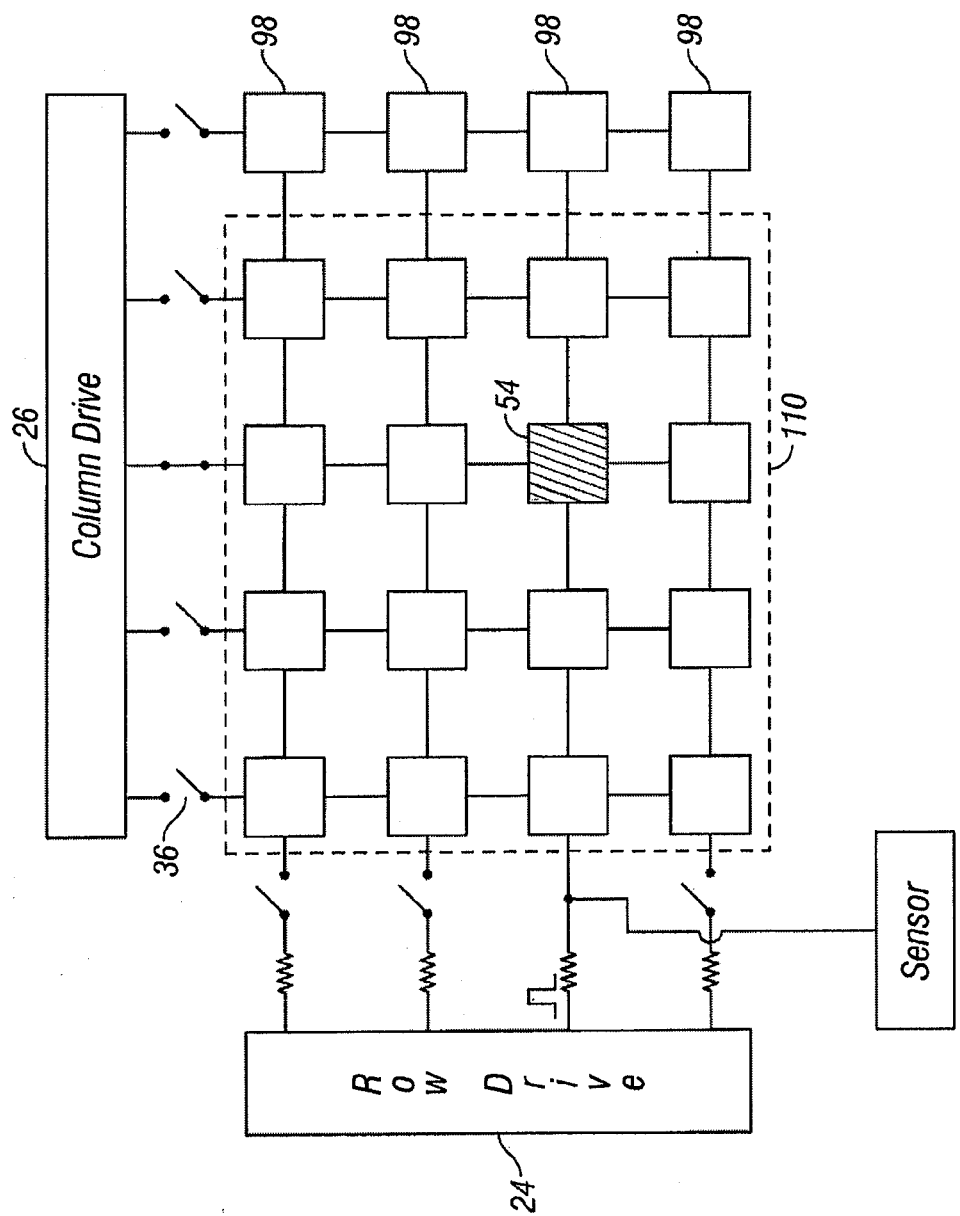
FIG. 12 is a block diagram of a state sensing apparatus for modulators embedded in arrays.

An implementation of this last process is illustrated in FIG. 11. After writing row 1 during the row 1 line time 90, a row 1 test time 92 is entered. In the first portion of this time period, only row 1 and column 1 are connected to the drive circuitry, and a test pulse 94 of about 1 volt or less is applied to row 1. As described above, the capacitance dependent response of pixel (1,1) is monitored to be sure it is in the actuated state as shown in FIG. 5A. This is repeated for pixels (1,2) and (1,3) during subsequent portions of the row 1 test time. The system then enters the row 2 line time, or alternatively, repeats the row 1 line time if it is determined that one or more pixels in row 1 have not been correctly written. For purposes of illustration, the test voltage amplitude is shown larger than generally desired and the test time period is shown much longer than would normally be necessary, as the pulse time periods for testing can be very short compared to the pulse periods used to actuate the pixels during the write process. When the pixel 54 being tested is part of a large array of tightly packed pixels, the testing process may be somewhat more complex. This is because the test pulse is applied to an entire row of pixels. Thus, the time constant of the charging process is dependent on the capacitance between the entire row electrode and the return column electrode, and this can be affected by the relative states of all the pixels in the row, not just on the state of the pixel being tested 54, shown again in FIG. 12. The dominant factor in the capacitance will be the state of the pixel being tested, but since there may be hundreds of pixels in the row, the combined effect of the remainder can be significant. There can also be capacitive coupling between pixels in different rows that share the same column electrode. The practical effect of this is that it may be advantageous to vary the pulse time period $\tau/3$, the $V_{thresh}$ value, or both, when testing pixels in a given row, depending on the states of the other pixels in the row.

This determination can be done in several ways. One embodiment illustrated in FIG. 12 can include in each row, at the end of the row outside the viewed area of the display, a test pixel 98. This pixel can be switched between states, and the rise times for the test pulse can be determined for both the actuated and released states. In this way, the time period having the maximum voltage difference between states, and the voltage values between which $V_{thresh}$ should be located could be determined based on the test pixel response. These values could then be used to test the state of the other pixels in the row.

Alternatively, a filter resistor could be placed at the end of the row instead of a test pixel. A collective capacitance measurement for the whole row electrode could then be made. The drive control circuitry could use this information to compute or look up an appropriate value for $\tau/3$, $V_{thresh}$, or both, to test the pixels in that row.

Figure 13:
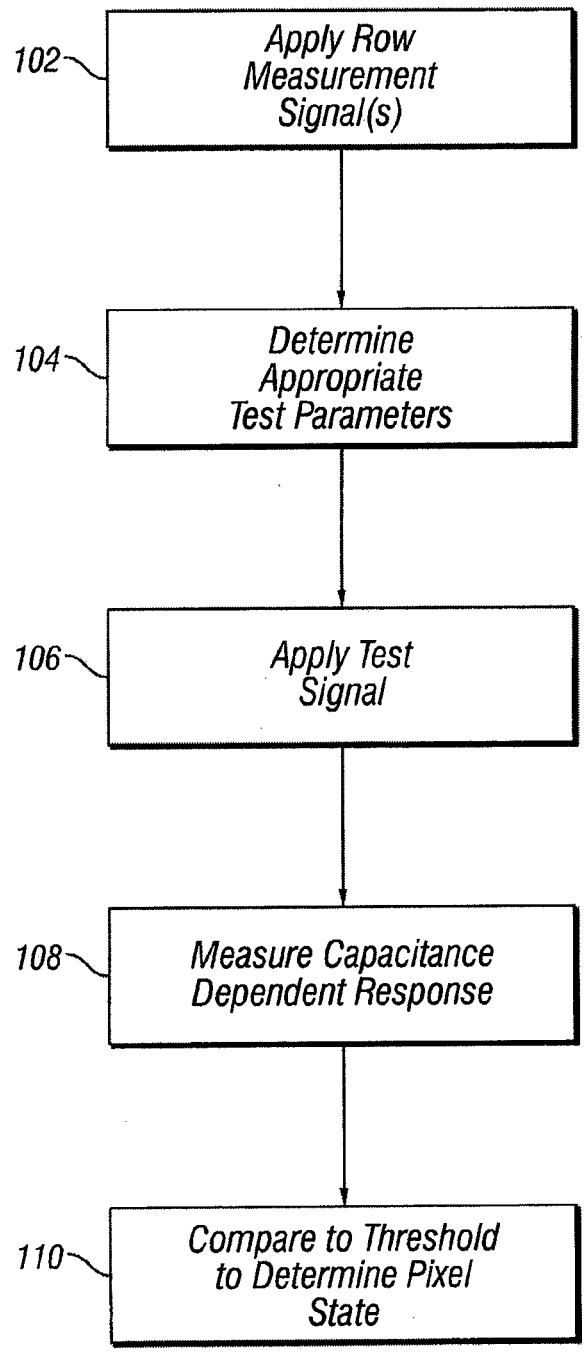
FIG. 13 is a flow chart of another embodiment of a state sensing process.

A general state sensing process using these principles for pixels embedded in arrays of rows and columns is illustrated in FIG. 13. At step 102, row measurement signals are applied to a row containing a pixel to be sensed. These signals could involve testing a test pixel or an overall row capacitance measurement as described above. At step 104, appropriate test parameters such as period $\tau/3$ and/or $V_{thresh}$ are determined for later pixel testing in the row. As in FIG. 10, a test pulse is then applied to the row at step 106. At step 108, a capacitance dependent response to the pulse is measured. At step 110, the response is compared to a threshold to determine the state of a selected pixel in the row.

Pulse amplitudes and durations for the pixel state sensing process may be selected based on a variety of desired factors. The pulse may be shaped to control the total charge injected into the row. For isolated pixels, the pulse current and time profile can be defined such that a pre-selected charge is injected into the pixel regardless of its capacitance value. In this case, the resulting voltage across the pixel will be inversely proportional to the pixel capacitance. It may be possible to use this method for pixels in an array as well, but its usefulness may be limited since the charge injected into the row may be distributed throughout the hundreds of row pixels in a way that is complicated and difficult to predict. Pulse durations may be selected based on the circuit $\tau$ value, with short pulses preferred for time savings. It is of course desirable that the potential applied to the pixel during this process remains at all times within the hysteresis window so that the state sensing process does not itself change the state of the pixel being sensed. Thus, the driver will advantageously supply the appropriate bias voltage when not applying a charging pulse and when not decoupled by the tri-state amplifiers, and will generate pulses deviating from this bias voltage that are small enough (e.g. no more than 1 or 2 volts typically) such that the applied pixel voltages are never outside of the hysteresis window.

Figure 14:
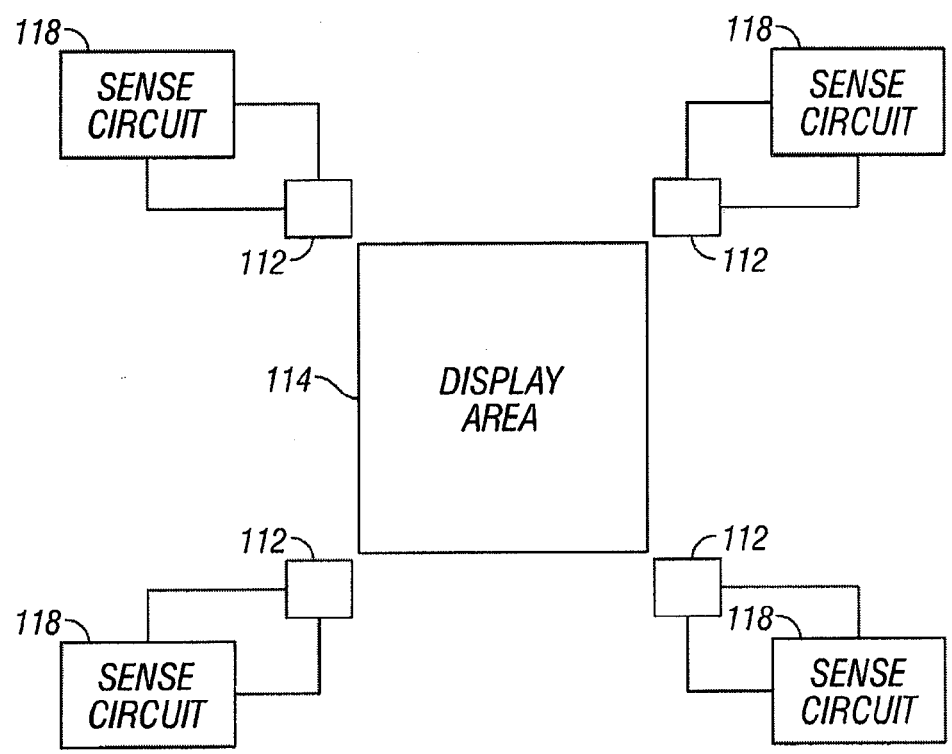
FIG. 14 is a block diagram of a display incorporating test pixels.

Another advantageous application of pixel state sensing is for determining the actuation and release voltages of a pixel. This can be useful because these voltages are temperature dependent, and may shift over time as well. Higher temperatures tend to shift the stability window of FIG. 3A closer to zero for metal mirrors on glass substrates. Depending on the relative coefficients of thermal expansion of the material layers, shifts of either direction as a function of temperature can occur. If pixel actuation and release voltages can be determined electrically, the drive voltages used to write image data to an array of pixels can be modified to match the current pixel behavior. A display incorporating this feature is illustrated in FIG. 14. In this embodiment, extra test pixels 112 are placed around the actual viewing area of the display 114. These test pixels may be fabricated during the same process that produces the display so that the physical characteristics are similar if not essentially identical with the physical characteristics of the pixels in the viewed display area 114. One or more sense circuits 118 that apply variable bias voltages and test voltages are coupled to the test pixels. It will be appreciated that some or all of the sense circuitry could be shared among multiple test pixels.

Figure 15:
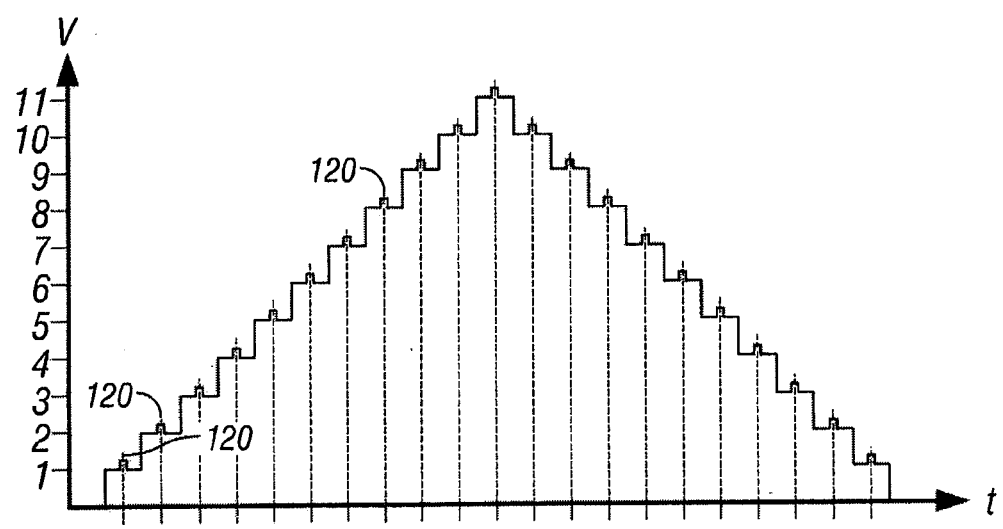
FIG. 15 is a graph of voltage versus time applied to a pixel which may be used to determine the actuation and release voltages of an interferometric modulator.

With separate test pixels, a variety of sensing protocols can be implemented to determine the actuation and/or the release voltages of a capacitive MEMS pixel. For example, this determination can be performed by applying a series of voltages across a pixel, and sensing the state at each applied voltage. This is illustrated in FIG. 15. The voltage can be stepped up from zero to a voltage that is above the expected actuation voltage under all conditions. At each voltage level, a pixel state test as described above may be performed to determine the pixel state. At some voltage level, the pixel will actuate, and this will be detected during the test. Pixel voltage can then be stepped down and tested at each level back down to zero. At some voltage level, the pixel will release, and this will again be detected by the test results.

In FIG. 15, the voltage step is one volt for each step, but it will be appreciated that any step size may be used. During each step, after the pixel has charged from the previous voltage transition, a test pulse 120 is applied as described above. The appropriate voltages or currents are monitored as desired, and the pixel state is determined at each voltage level. Ranges for the actuation and release voltages can be determined by determining which step caused a state change. Advantageously, the amplitude and duration of the test pulses are less than the step size and duration.

Figure 16:
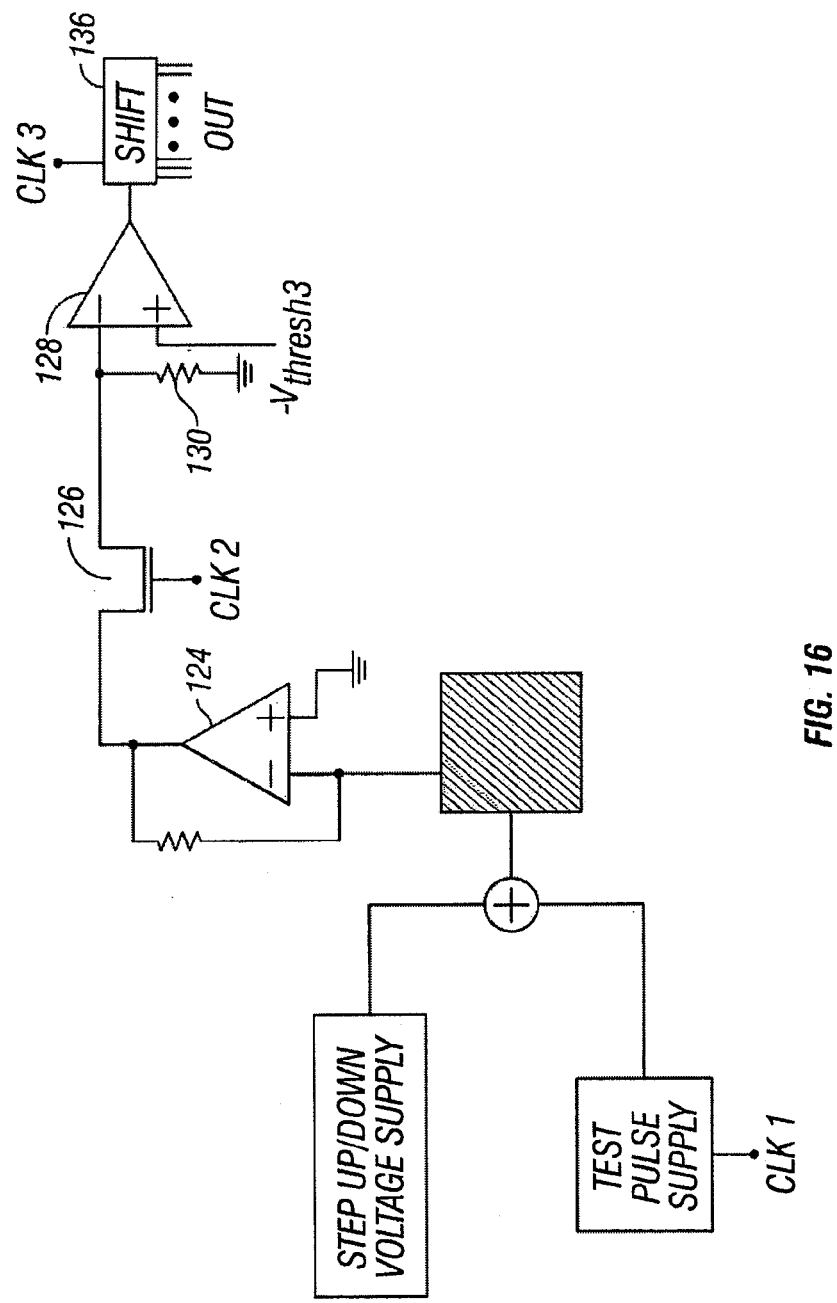
FIG. 16 is a schematic of a circuit which may be used to determine the actuation and release voltages used with the voltage versus time voltage application of FIG. 15.
Figure 17:
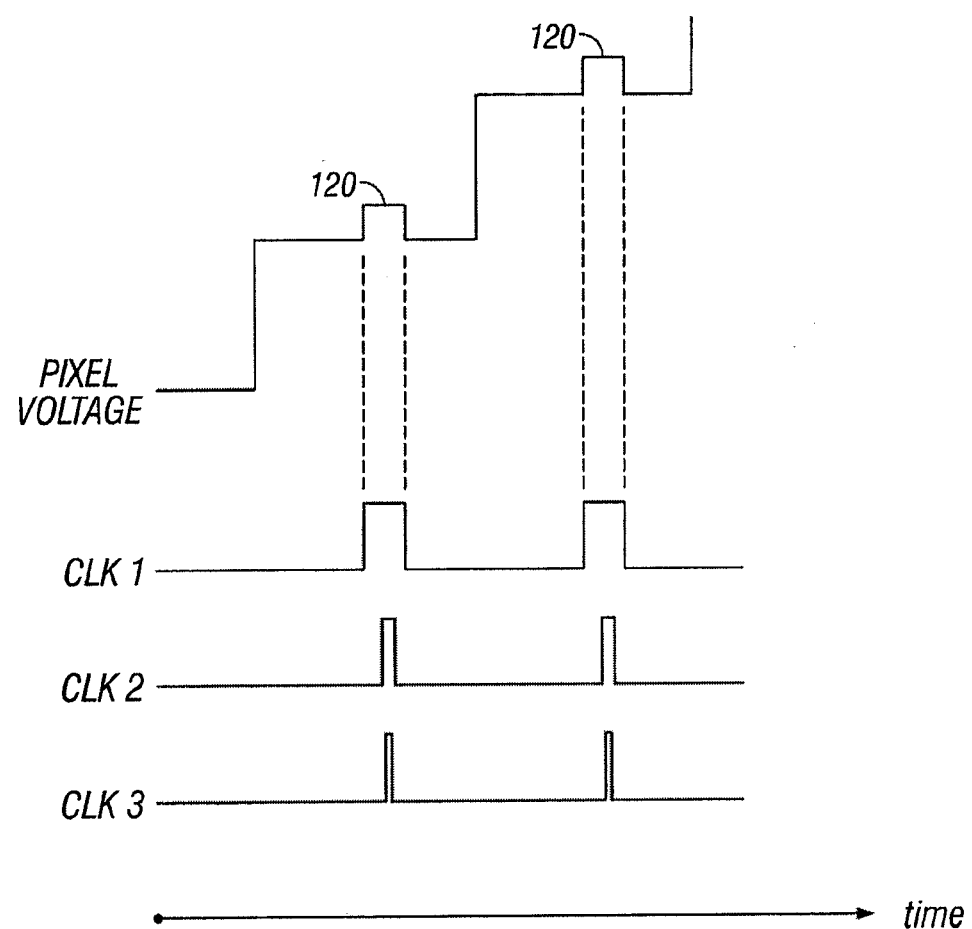
FIG. 17 is a graph illustrating the timing of the circuit of FIG. 16.

FIGS. 16 and 17 illustrate a circuit and its operation that can implement the method of FIG. 15. In this embodiment, a test pulse is added to a series of stepped up and stepped down voltages and the signal sum is applied to one side of a pixel. The other side is grounded with an inverting current to voltage converter 124. A switch 126 connects the output of the current to voltage converter to the input of a comparator 128. As shown in FIG. 17, the CLK1 signal attached to the test pulse generator produces the test pulse duration. As illustrated in FIG. 9 and described above, the test pulse produces a current pulse through the test pixel that decays much slower for an actuated pixel than for a released pixel. The CLK2 signal controls the connection between the output of the current to voltage converter 124 and the input to the comparator 128. The input to the comparator is pulled low by resistor 130 when the switch 126 is open. The CLK2 signal is timed to have a rising edge delayed from the rising edge of CLK1 and have a short duration to sample the voltage output from the current to voltage converter 124 at a selected point in time during the charging process. This voltage will be higher for an actuated pixel than for a released pixel. If the voltage is more negative than −Vthresh3 (negative because of the inverting amplifier 124) during the CLK2 sample period, this indicates an actuated pixel, and the output of the comparator 128 will be high during the sample period. This is repeated sequentially for each test pulse, and the series of comparator outputs are shifted into a shift register 136 at times determined by signal CLK3 which is within the assertion time of CLK2. The outputs of the shift register 136 then form a record of the actuated vs. released state of the pixel at each level on the way up and back down.

Figure 18:
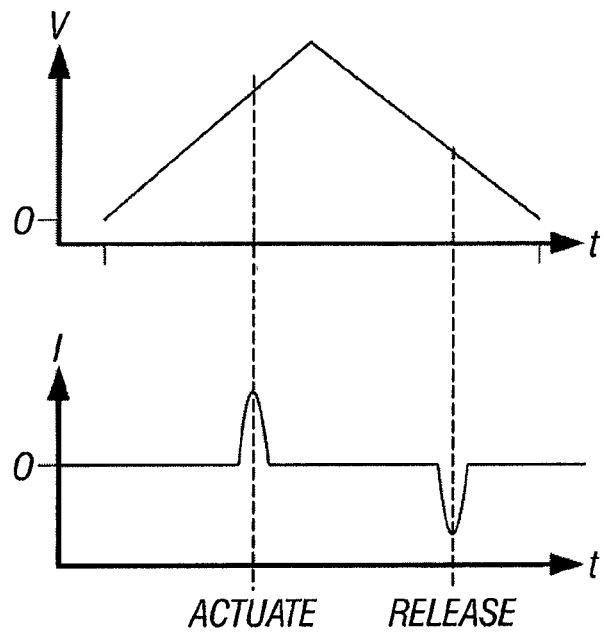
FIG. 18 is a graph of another embodiment of a voltage versus time applied to a pixel and current versus time response which may be used to determine the actuation and release voltages of an interferometric modulator
Figure 19:
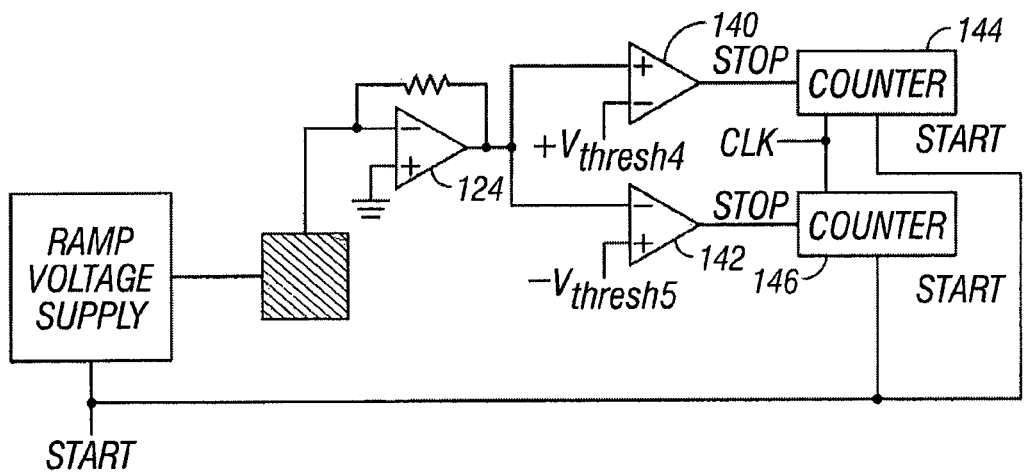
FIG. 19 is a schematic of a circuit which may be used to determine the actuation and release voltages with the voltage versus time voltage application of FIG. 18.

FIGS. 18 and 19 illustrate another circuit implementation that can be used to determine actuation and release voltages of a bistable pixel. If the voltage on the pixel is increased at a rate that is slow compared to the pixel RC charging time constant and the time it takes for a pixel to switch between states, the current will be very low while the voltage is ramped up. This will be true until the pixel changes to the actuated state and the capacitance quickly increases. This will cause a current pulse to flow during the transition to a high capacitance state. On the ramp back downward, a second current pulse in the opposite direction (quickly reducing the charge on the pixel capacitance) will occur.

These current pulses can be detected by the circuit of FIG. 19. In this embodiment, the output of the current to voltage converter 124 is coupled to a pair of comparators 140 and 142. Both comparator outputs will both be low when the charging current is small. During the first current pulse, the output of comparator 140 will go high. During the second current pulse, the output of comparator 142 will go high. The time at which these pulses occur can be determined by having each output pulse from the comparators stop a respective counter 144, 146 that is started at the same time the ramp is started. The counter values can be associated with the actuation and release voltages because the voltage as a function of time of the applied voltage ramp is known.

Figure 20:
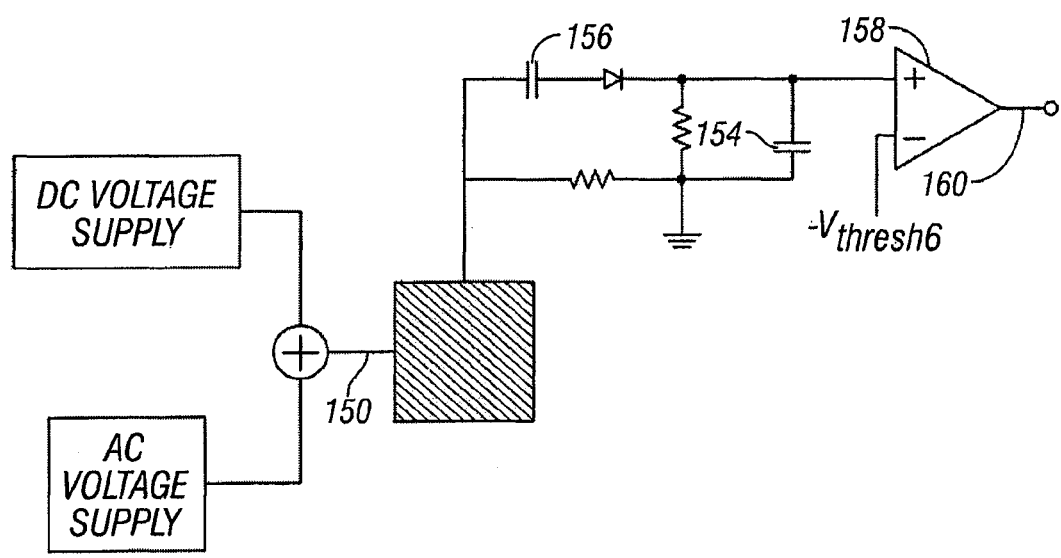
FIG. 20 is a schematic of another embodiment of a circuit which may be used to determine the actuation and release voltages of an interferometric modulator.

Another possible test circuit is illustrated in FIG. 20. In this embodiment, an AC signal is placed on top of a DC bias voltage and is applied to the pixel at node 150. More AC current will flow through the pixel when the pixel is actuated than when it is released. This AC current can be detected by including both a DC coupled path to ground and an AC coupled path to ground on the other plate of the pixel. The DC voltage across capacitor 154 will increase with increasing AC current through the pixel and through capacitor 156. This voltage is routed to a comparator 158, which goes high if this value is above Vthresh6, which is determined based on the component values. In this embodiment, the DC bias voltage can be varied in any manner, and the output 160 of the comparator 158 will be high when the pixel is actuated, and low when the pixel is released.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As one example, it will be appreciated that the test voltage driver circuitry could be separate from the array driver circuitry used to create the display. As with current sensors, separate voltage sensors could be dedicated to separate row electrodes. The scope of the invention is indicated by the appended claims rather than by the foregoing description. All changes which come within the meaning and range of equivalency of the claims are to be embraced within their scope.

The invention claimed is:

1. A system comprising:
   one or more electromechanical devices;
   a drive circuit configured to apply one or more test voltages or currents; and
   a sensing circuit configured to sense a state of at least one of the one or more electromechanical devices and determine one or both of an actuation voltage and a release voltage based at least in part on the sensed state of the at least one of the one or more electromechanical devices, wherein the sensing circuit is further configured to compare a sensed voltage of said at least one of the one or more electromechanical devices to a threshold voltage.

2. The system of claim 1, wherein the one or more electromechanical devices includes one or more display elements.

3. The system of claim 1, wherein the one or more electromechanical devices are arranged in an array to display images in response to signals from the drive circuit.

4. The system of claim 1, wherein the sensing circuit includes resistive and capacitive elements in parallel.

5. The system of claim 1, wherein the sensing circuit includes an integrator with one or more passive feedback components.

6. The system of claim 1, further comprising a timing control circuit.

7. The system of claim 6, wherein the timing control circuit and the sensing circuit are embodied in an integrated circuit.

8. The system of claim 6, wherein the timing control circuit controls an activation of the one or more electromechanical devices.

9. The system of claim 1, wherein the one or more electromechanical devices include one or more interferometric modulators.

10. The system of claim 1, wherein the one or more electromechanical devices include a reflective surface.

11. The system of claim 1, wherein the one or more electromechanical devices can be positioned in a reflective position and a non-reflective position.

12. The system of claim 1, wherein the one or more electromechanical devices are movable.

13. A method of determining one or both of an actuation voltage and a release voltage, the method comprising:
   applying one or more test voltages or current to at least one electromechanical device;
   comparing a sensed voltage of the at least one electromechanical device to a threshold voltage;
   determining a state of the at least one electromechanical device based on the comparison; and
   determining one or both of an actuation voltage and a release voltage based at least in part on the determined state of the at least one electromechanical device.

14. The method of claim 13, wherein the at least one electromechanical device includes one or more display elements.

15. The method of claim 13, further comprising controlling an activation of the electromechanical device.

16. A method of modifying a drive voltage, the method comprising:
- applying a first test voltage or current to charge an electromechanical device for a first predetermined amount of time;
- comparing a first sensed voltage of the electromechanical device to a threshold voltage;
- determining a first actuation or release voltage based on the comparing of the first sensed voltage;
- applying a second test voltage or current to charge the electromechanical device for a second predetermined amount of time;
- comparing a second sensed voltage of the electromechanical device to the threshold voltage;
- determining a second actuation or release voltage based on the comparing of the second sensed voltage; and
- modifying the drive voltage based on the determined first and second actuation or release voltages to control a voltage at which the electromechanical device is actuated or released.

17. The method of claim 16, wherein the first predetermined amount of time is substantially the same as the second predetermined amount of time.

18. The method of claim 16, wherein the first predetermined amount of time is different than the second predetermined amount of time.

19. A system for determining one or both of an actuation voltage and a release voltage, the method comprising:
- means for applying one or more test voltages or current to at least one electromechanical device;
- means for comparing a sensed voltage of the at least one electromechanical device to a threshold voltage;
- means for determining a state of the at least one electromechanical device based on the comparison; and
- means for determining one or both of an actuation voltage and a release voltage based at least in part on the determined state of the at least one electromechanical device.

20. The system of claim 19, further comprising means for controlling an activation of the electromechanical device.

21. A system for calibrating a drive voltage, the system comprising:
- means for applying a first test voltage or current to charge an electromechanical device for a first predetermined amount of time;
- means for comparing a first sensed voltage of the electromechanical device to a threshold voltage;
- means for determining a first actuation or release voltage based on the comparing of the first sensed voltage;
- means for applying a second test voltage or current to charge the electromechanical device for a second predetermined amount of time;
- means for comparing a second sensed voltage of the electromechanical device to the threshold voltage;
- means for determining a second actuation or release voltage based on the comparing of the second sensed voltage; and
- means for modifying the drive voltage based on the determined first and second actuation or release voltages to control a voltage at which the electromechanical device is actuated or released.

22. The system of claim 21, wherein the first predetermined amount of time is different than the second predetermined amount of time.

* * * * *